United States Patent [19]

Bartholomew

[11] Patent Number: 5,440,278

[45] Date of Patent: Aug. 8, 1995

[54] FERRITE SYSTEM FOR MODULATING, PHASE SHIFTING, OR ATTENUATING RADIO FREQUENCY ENERGY

[76] Inventor: Darin Bartholomew, 1411 S. Algonquin Dr., Schaumburg, Ill. 60193-4846

[21] Appl. No.: 217,928

[22] Filed: Mar. 25, 1994

[51] Int. Cl.⁶ .......................... H03C 3/00; H01P 1/175
[52] U.S. Cl. ................................ 332/103; 333/21 A; 333/230
[58] Field of Search ................ 332/103, 104, 105; 333/24.3, 158, 230, 21 A, 227, 228; 342/361, 362, 363, 364, 365, 366; 343/756

[56] References Cited

U.S. PATENT DOCUMENTS

| | | | |
|---|---|---|---|
| 3,639,862 | 2/1972 | Craven et al. | 333/73 W |
| 3,680,010 | 7/1972 | Buck | 333/31 A |
| 4,458,218 | 7/1984 | Babbitt et al. | 333/158 |
| 4,459,567 | 7/1984 | Stern et al. | 333/24.2 |
| 4,490,700 | 12/1984 | Stern et al. | 333/258 |
| 4,542,357 | 9/1985 | Stern et al. | 333/24.2 |
| 4,691,208 | 9/1987 | Stern et al. | 343/785 |
| 5,066,958 | 11/1991 | Blachley | 333/21 A X |
| 5,075,648 | 12/1991 | Roberts et al. | 333/128 |
| 5,122,810 | 6/1992 | Nisbet et al. | 343/756 |
| 5,128,637 | 7/1992 | Nisbet et al. | 333/24.3 |
| 5,172,081 | 12/1992 | Gabriel et al. | 333/21 A |
| 5,184,097 | 2/1993 | Brouzes et al. | 333/202 |
| 5,229,737 | 7/1993 | Prime | 333/24.3 |
| 5,260,713 | 11/1993 | Motson | 343/756 |

*Primary Examiner*—David Mis
*Attorney, Agent, or Firm*—Darin E. Bartholomew

[57] ABSTRACT

The radio frequency ferrite system for modulating, phase shifting, or attenuating radio frequency energy has a resonator, a ferrite polarizer, and coupling devices. The coupling devices are used to couple radio frequency signals to and from an interior of the resonator. The ferrite polarizer generates magnetic fields corresponding to an applied voltage or current. To produce phase modulation the ferrite polarizer may be used to detune the cavity from resonance by changing the orientation of the radio frequency signal with respect to a protrusion in the resonator. The ferrite system may be used for phase modulation, switching radio frequency signals, and amplitude modulation by arranging the coupling devices in various orientations and by simultaneously changing the polarization of radio frequency signals with the ferrite polarizer. Another aspect of the ferrite system, uses a waveguide, a ferrite polarizer, coupling devices, and a combiner for phase shifting, phase shift keying modulation, or phase modulation.

30 Claims, 6 Drawing Sheets

FERRITE SYSTEM FOR MODULATING, PHASE SHIFTING, OR ATTENUATING RADIO FREQUENCY ENERGY

BACKGROUND ART

The present invention is directed toward a ferrite system concerning switching, attenuating, varying the phase of radio frequency waves, and varying the amplitude of radio frequency waves. More specifically, the present invention concerns a ferrite system for phase modulation, phase shift keying, or phase shifting that can be used in microwave communications equipment, such as transmitters, receivers, and phased array antennas.

The prior art has typically used capacitive coupling inherent in the base-collector junction of a transistor to provide phase modulation of a radio frequency carrier. FIG. 1 illustrates phase modulation using the inherent capacitive coupling of a base-collector junction. A radio frequency (RF) oscillator 50 applies a carrier with phase A to the base of a transistor 60. The transistor 60, in Class C amplification, amplifies when both the audio/data frequency input 52 and the RF oscillator input 50 are sufficiently positive to forward bias the base-emitter junction. The transistor 60 also amplifies when either the audio/data frequency input 52 or the RF oscillator input 50 is sufficiently positive to forward bias the base-emitter junction. The phase C at the collector of transistor 60 is 180 degrees lagging the phase A at the base of the transistor 60 because the transistor 60 is in a common-emitter amplifier configuration. The capacitive base-collector junction has a base-collector capacitance 64 that is reduced in response to increased reverse bias on the base-collector junction of transistor 60. If the resonant circuit 66 has a relatively high quality factor (Q), approaching that of a typical crystal, then the slight capacitive variations of the base-collector junction will detune the resonant circuit 66 from resonance, resulting in phase modulation. Detuning can occur through the collector-emitter path to ground via the base-collector capacitance 64. The degree of phase shift B is controlled by the magnitude of the audio/data frequency input 52 applied to the base of the transistor 60 because the audio/data frequency input 52 varies the value of the base-collector capacitance 64; hence, varies the capacitance of the resonant circuit 66 as well. The aggregate phase at the output terminal 62 comprises components of phase B and phase C.

While the capacitive coupling or reactance modulation technique works well below microwave frequencies (i.e. below approximately 0.9 GHz), at microwave frequencies semiconductor manufacturers strive to reduce the base-collector capacitance of transistors to increase the maximum operating frequencies of radio frequency (RF) transistors. Microwave radio frequency (RF) transistors employ special junction geometries and exotic semiconductor materials to approach the ideal base-collector capacitance of zero picofarads. To phase-modulate a microwave RF carrier frequency, prior art devices typically phase-modulate a low-frequency carrier (i.e. VHF or UHF) and then multiply the carrier up to the desired microwave frequency. The disadvantage of frequency multiplication is that unwanted harmonics are produced, and elaborate filtering is needed to remove these harmonics to comply with Federal Communications Commission (FCC) emission standards. Thus, a need exists for a phase modulator which operates independently of the base-collector capacitance of the transistor and which can directly modulate a microwave frequency carrier.

SUMMARY OF THE INVENTION

The present invention is directed toward a ferrite system for manipulating radio frequency energy, which provides phase modulation or phase shifting of a radio frequency carrier independent of the internal capacitances of semiconductors. The ferrite system for manipulating RF energy can modulate or phase shift a radio frequency carrier anywhere along the signal path, and even, for example, after power radio frequency amplification. Moreover, because the ferrite system can be employed in the signal path immediately before the transmitting antenna, distortion of the modulated radio frequency signal from later amplification stages is eliminated.

One embodiment of the ferrite system for manipulating RF energy uses the combination of a resonator, a ferrite polarizer, a plurality of coupling devices, and a protrusion. The plurality of coupling devices is used to couple radio frequency signals or energy to and from an interior of the resonator. The protrusion is a conductive obstruction located within the interior of the resonator. The protrusion is an inductance or a capacitance at microwave, UHF, and VHF frequencies, depending upon the shape and orientation of the protrusion. The ferrite polarizer generates magnetic fields according to an applied voltage. The ferrite polarizer detunes the cavity from resonance by changing the polarization of the radio frequency energy in the resonator. The changing polarization changes the orientation of the protrusions with respect to the radio frequency waves. Hence, the capacitance or the inductance of the resonator varies and phase modulation results. The propagation modes of the radio frequency energy may be coupled from the resonator via substantially elliptical or circular coupling waveguide; especially when phase modulation is desired.

Another embodiment of the ferrite system includes a waveguide, a ferrite polarizer, a switching network, an energy regulator (i.e. voltage regulator), and a combiner. The switching network accepts a modulating signal source. The switching network controls a magnetic field within the waveguide or waveguide cavity by controlling the ferrite polarizer. The magnetic field induced by the ferrite polarizer alters the proportion of waves propagating in a first mode (i.e. $TE_{1,0}$) relative to the proportion of waves propagating in a second mode (i.e. $TE_{0,1}$). Waves propagating in the first mode are coupled to the combiner at phase X, magnitude R. Meanwhile, waves propagating in the second mode are coupled to the combiner at phase Y, magnitude S. In practice, propagation modes other than the first mode and the second mode may be induced within the waveguide by the operation of the Faraday rotation of the ferrite polarizer or by using variations in the coupling devices to further affect the attenuation and the phase of the resultant signal. Vector addition of the four variables X, R, Y and S, corresponding respectively to the first mode and second mode waves, produces controllable variations in phase.

DESCRIPTION OF THE DRAWINGS

FIG. 5 illustrates the alternate ferrite polarizer and schematically illustrates one possible embodiment of the switching network.

DETAILED DESCRIPTION

For convenience, the present invention is referred to as the "ferrite system for manipulating radio frequency energy" and the "ferrite system" throughout the claims and the specification. The ferrite system for manipulating radio frequency energy has a multitude of applications. While the ferrite system is primarily configured for phase modulation or phase shifting of a radio frequency signal, the ferrite system can also be used to attenuate a radio frequency signal, to amplitude modulate a radio frequency signal, to switch a radio frequency signal, or to process the radio frequency signal by any combination of attenuation, modulation, and switching. Generally, the preceding functions of the ferrite system for manipulating RF energy derive from the orientation of coupling devices with respect to the interior of a resonator and the degree of polarity shifting (i.e. Faraday rotation) introduced by the ferrite polarizer with respect to the coupling devices.

Ferrite System Embodiment Having a Resonator and a Protrusion

Figure 1:
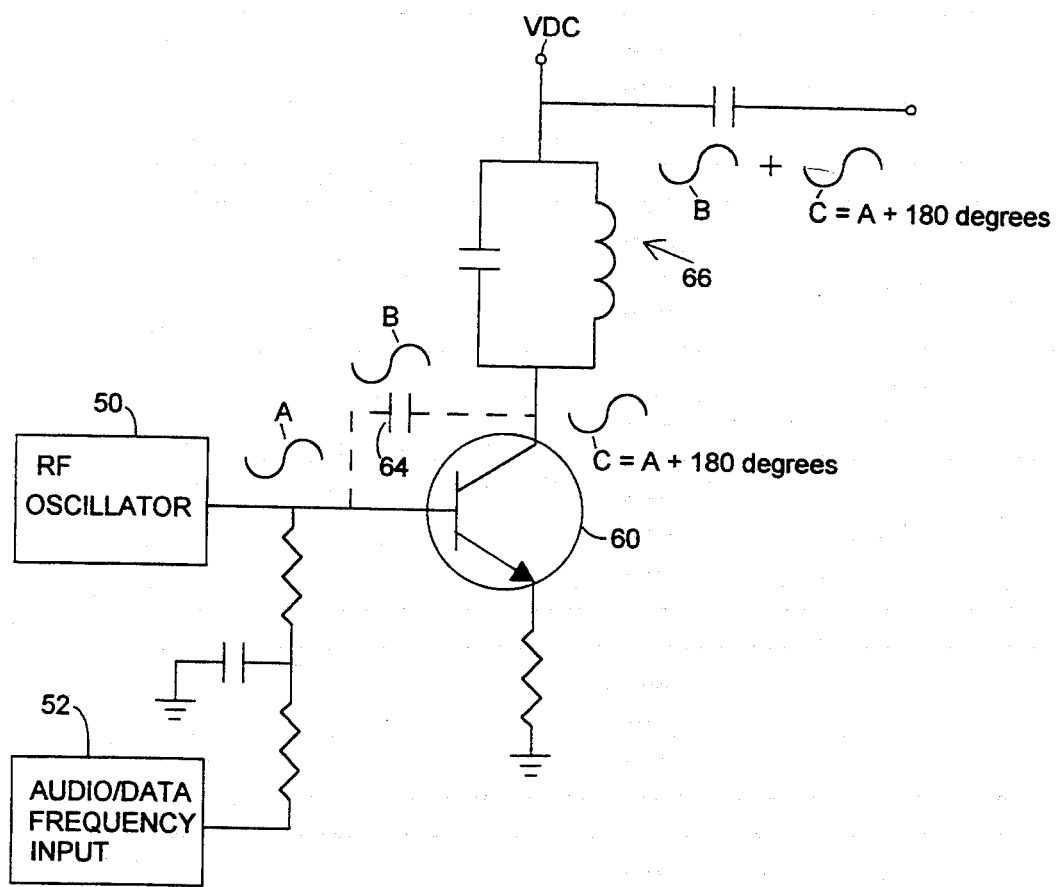
FIG. 1 is a schematic of a prior art circuit for phase modulation.
Figure 2:
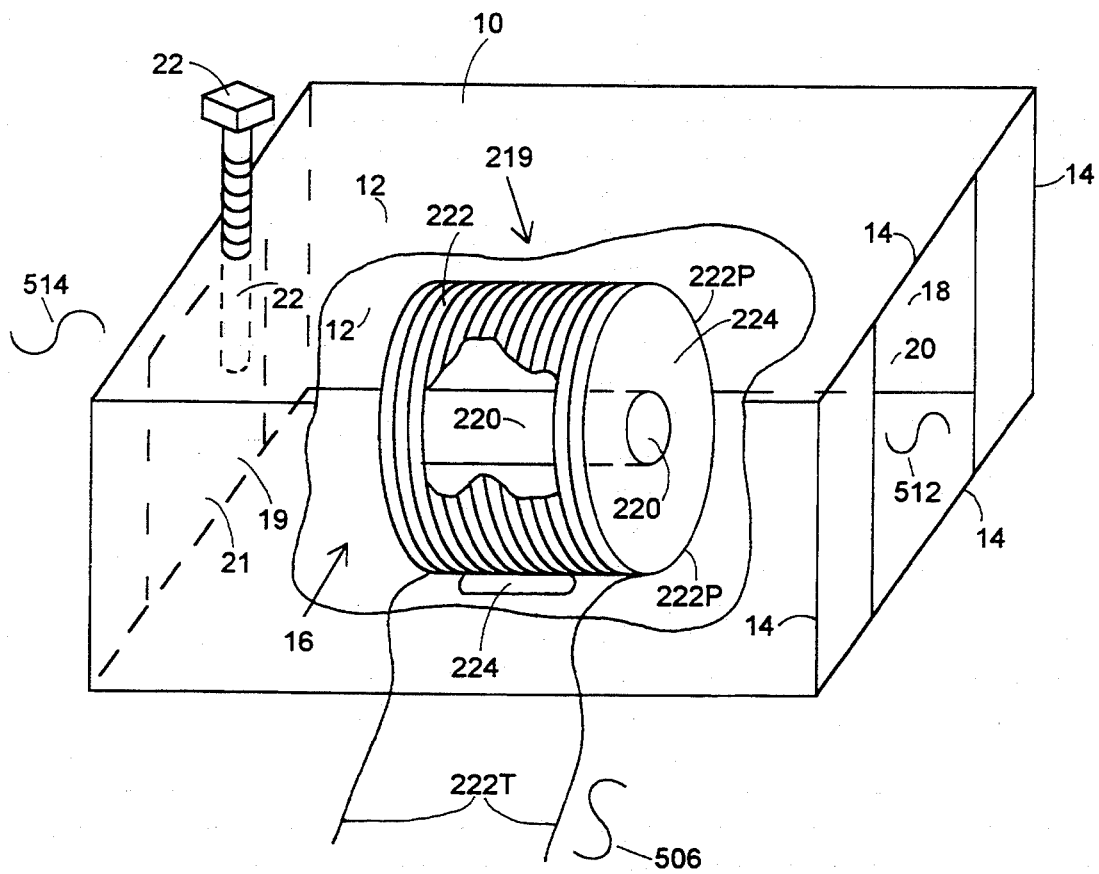
FIG. 2 is a perspective view of one embodiment of the ferrite system for manipulating radio frequency energy with portions of the resonator cut away to reveal the resonator interior and the ferrite polarizer.

FIG. 2 illustrates one embodiment of the ferrite system for manipulating RF energy. Referring to FIG. 2, the main elements of the ferrite system for manipulating RF energy are a resonator 10, first coupling means for coupling 18 RF energy into the resonator 10, second coupling means for coupling 19 RF energy from the resonator 10, a protrusion 22, and a ferrite polarizer 219. The resonator 10, or resonant cavity, has resonator walls 12, a resonator cross section 14, and a resonator interior 16. The first coupling means 18 and the second coupling means 19 constitute apertures, slots, capacitive probes, inductive probes, capacitive-inductive probes, or any combination of the foregoing. As illustrated in FIG. 2, the first coupling means 18 and the second coupling means 19 comprise a first slot 20 and a second slot 21, respectively.

The ferrite system may, but need not, include a protrusion 22. The embodiment of the ferrite system illustrated in FIG. 2 utilizes the protrusion 22 for phase modulation or to facilitate a resonant circuit within the resonator interior 16. Amplitude modulation may be accomplished with or without the protrusion 22.

The protrusion 22 can have a virtually infinite variety of shapes to obtain the desired inductance or capacitance with respect to the radio frequency waves within the resonator 10. For predictability in the value of reactance, capacitance, or inductance, the protrusion 22 is generally substantially cylindrical, substantially rectangular, or substantially co-planar. For example, a cylindrical protrusion 22 partially spanning the resonator cross section 14 in the resonator interior 16 has a capacitive effect, while a cylindrical protrusion 22 spanning the entire resonator cross section 14 has an inductive effect for a wave propagating in a single mode. The protrusion 22 may be a bolt, screw, or stud with a plurality of threads. Respective threads of the bolt, screw, or stud may engage corresponding threads attached to one resonator wall 12. Consequently, the surface area of the protrusion 22 in the resonator interior 16 can be changed by rotating the bolt, screw, or stud with respect to the resonator 10.

Generally, the protrusion 22 is located in the resonator interior 16. The protrusion 22 may be located adjacent to, or coextensive with, the second coupling means 19. As shown in FIG. 2, the protrusion 22 is located substantially coextensive with second slot 21.

The ferrite polarizer 219 includes ferrite material 220, dielectric material 224, a coil 222, a coil terminal 222T, and a coil perimeter 222P. The ferrite polarizer 219 is preferably disposed in the resonator interior 16. The dielectric material 224 secures the ferrite polarizer 219 or the ferrite material 220 relative to the resonator interior 16. The coil perimeter 222P coaxially surrounds the ferrite material 220. The coil 222 may, but need not be, secured to the ferrite material 220 via dielectric material 224. One or more coil terminals 222T accept a control current to regulate the degree of phase shift.

If, for example, a modulating signal 506 is applied directly or indirectly to at least one coil terminal 222T, while a radio frequency carrier signal 512 is applied at the first slot 20, then a modulated output signal 514 is present at the second slot 21. If the protrusion 22 is positioned at the second slot 21, then the modulated output signal 514 is optimally fed through an elliptical or circular coupling waveguide which is at least several electrical wavelengths long. One or more desired propagation modes are then coupled from the elliptical or circular coupling waveguide according to methods known to one of ordinary skill in the art.

Ferrite System Embodiments Having Waveguides and Combiners

Figure 3:
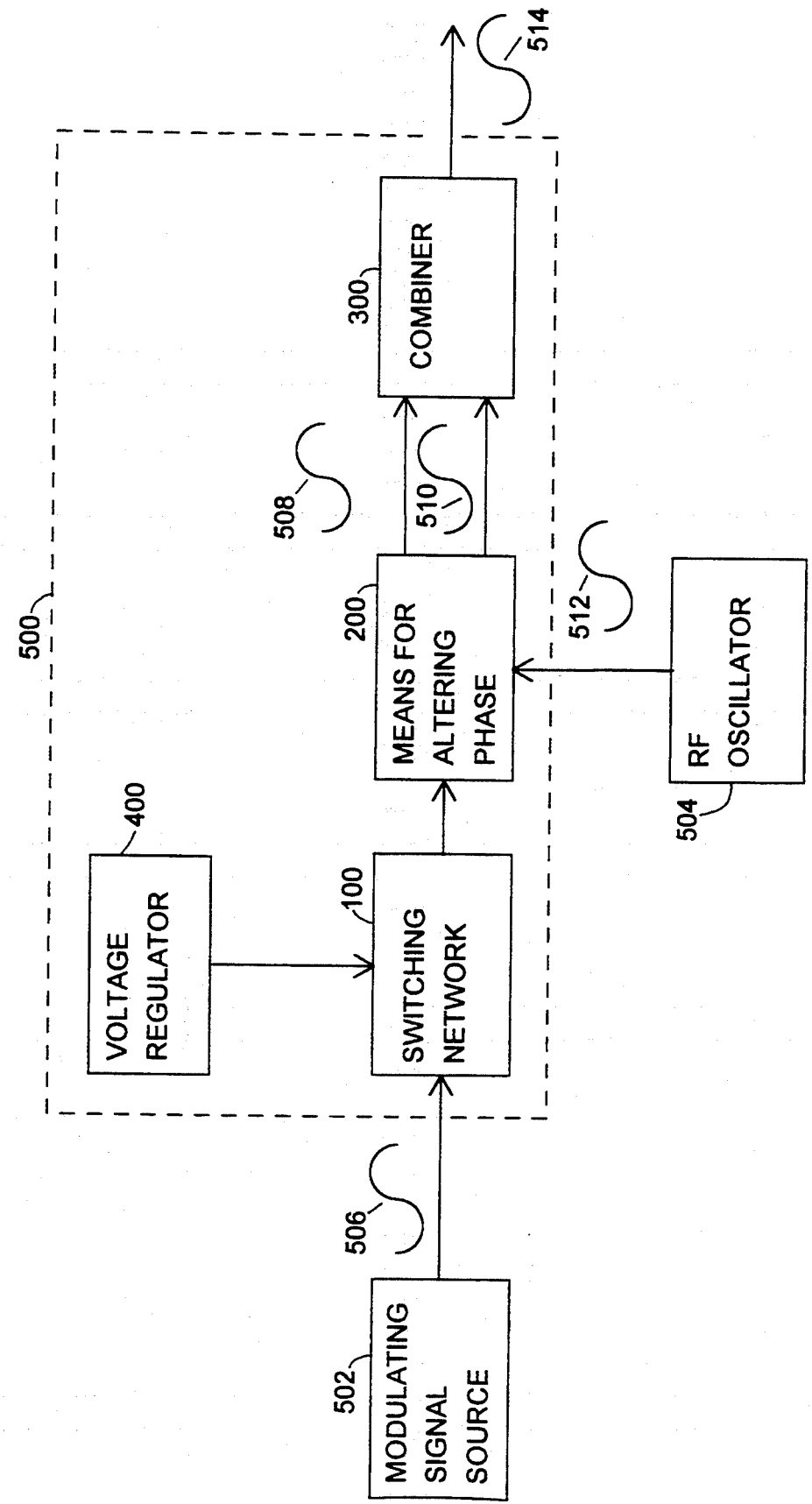
FIG. 3 is a block diagram of another embodiment of the ferrite system for manipulating radio frequency energy as configured for phase modulation or phase shifting of a radio frequency carrier.

FIG. 3 generally illustrates the main elements of other embodiments of the ferrite system for manipulating radio frequency energy. The block diagram of the ferrite system 500 in FIG. 3 is shown in further detail in FIG. 4 and FIG. 5. Note that FIG. 3, FIG. 4 and FIG. 5, contain a modulating signal source 502 and an RF oscillator 504. Neither the modulating signal source 502, nor the RF oscillator 504 are essential for the proper operation of the ferrite system 500. Rather, the modulating signal source 502 and the RF oscillator 504 are merely present to provide an illustrative example of the operation of the ferrite system 500. Referring to FIG. 3, one embodiment of the ferrite system 500 has means for altering the phase 200 of radio frequency energy, a switching network 100, an energy regulator (i.e. voltage regulator 400), and a combiner 300.

Means for Altering the Phase of Radio Frequency Energy

Figure 4:
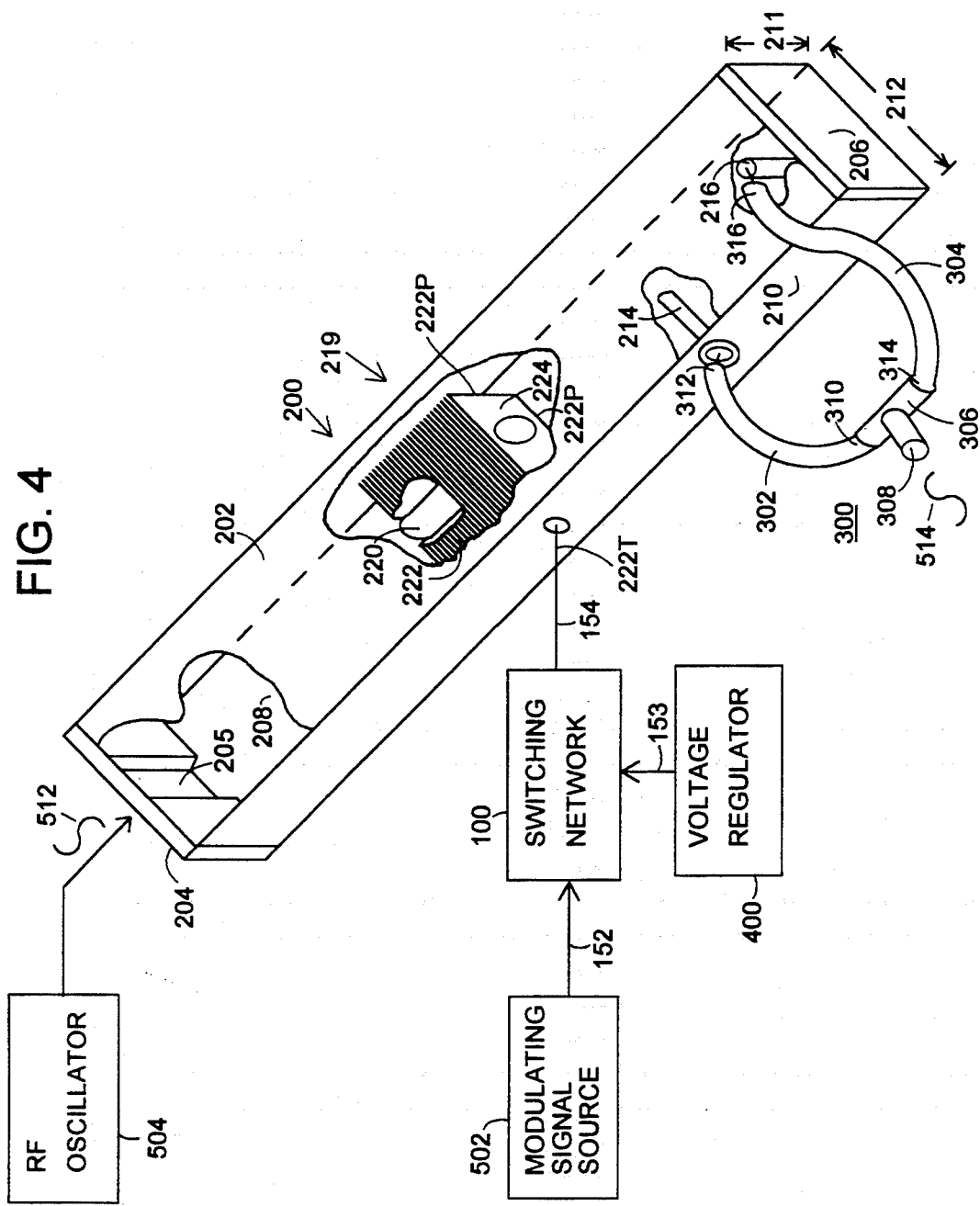
FIG. 4 is a detailed perspective view of a first embodiment of the ferrite system for manipulating radio frequency energy shown in FIG. 3.
Figure 5:
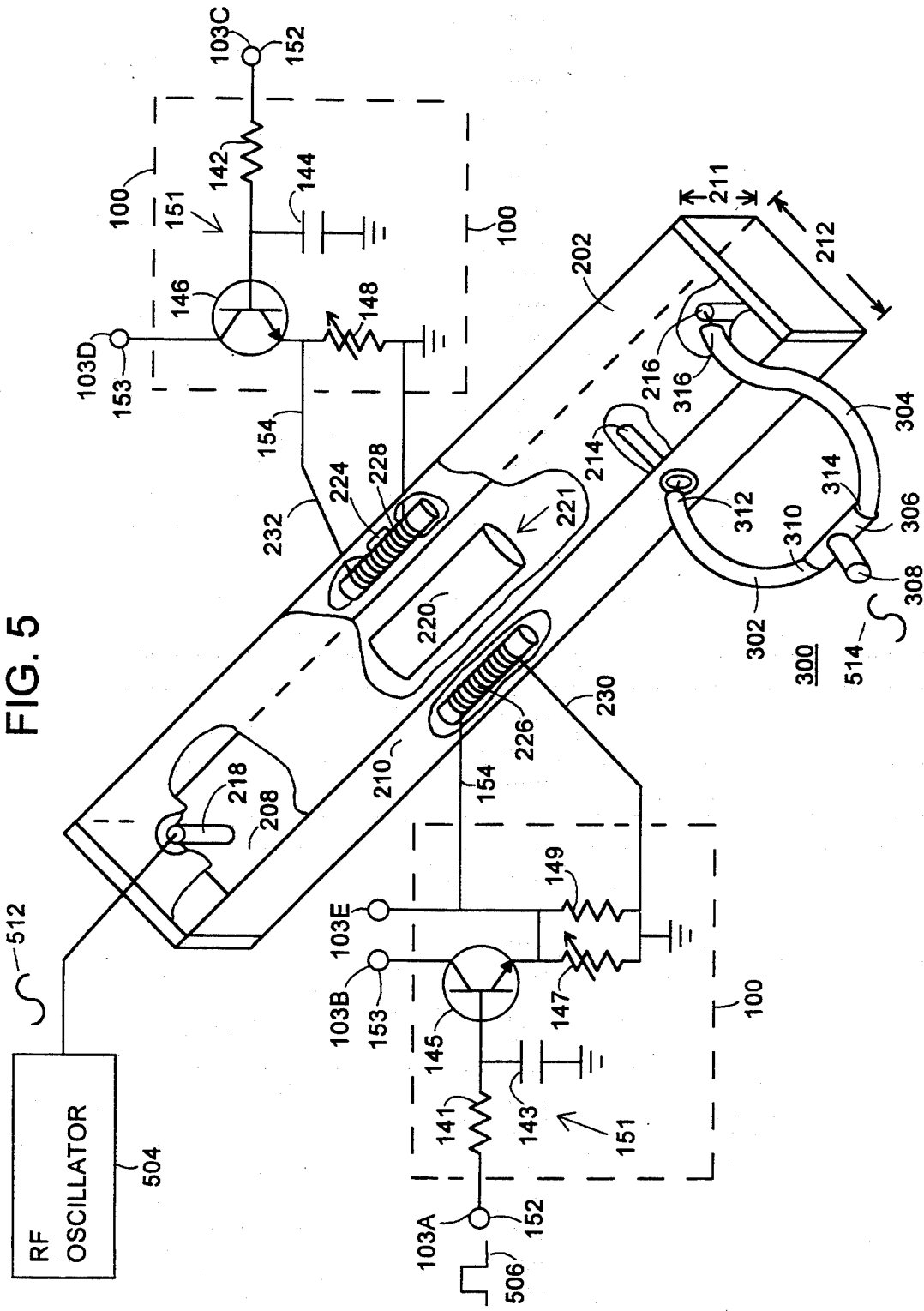
FIG. 5 is a detailed perspective view of a second embodiment of the radio frequency ferrite system shown in FIG. 3.

Generally, the means for altering the phase 200 of radio frequency energy includes (a) a waveguide, a terminating section of waveguide, a conventional cavity, or an appropriately segregated portion of a waveguide so as to form a waveguide cavity; (b) capacitive probes, inductive loops, apertures, or other coupling devices; and (c) a ferrite polarizer. Referring to FIG. 4 and FIG. 5, the means for altering the phase 200 of RF energy encompasses the waveguide 202, the first output coupling device 214, the second output coupling device 216, and the ferrite polarizer 219. The means for altering phase 200 either includes an opening 205 defined in a first end 204 (as shown in FIG. 4) or the input probe 218 (as shown in FIG. 5).

The waveguide 202 is preferably substantially rectangular or square and principally allows propagation of the wave in a plurality of orthogonal modes. Orthogonal modes are propagation modes with substantially perpendicular electric fields. The plurality of orthogonal modes includes a first mode 508 (i.e. $TE_{1,0}$) and a second mode 510 (i.e. $TE_{0,1}$), among other modes. The first mode 508 has an electric field which is substantially perpendicular to electric field of the second mode 510. Numerous shapes of waveguides 202 or cavities with corresponding variations in probes could be employed to implement the ferrite system 500. In a square waveguide, a waveguide with a substantially equal height 211 and width 212, the first mode 508 and the second mode 510 have the same cut-off frequency and propagate equally well. However, note that as the width 212 becomes longer than the height 211 of a waveguide the frequency of the radio frequency carrier signal 512 (i.e. microwave energy) must exceed two different cut-off frequencies, namely, the cut-off frequency in the first mode 508 and the cut-off frequency of the second mode 510.

The waveguide 202 optimally comprises a waveguide or any section of waveguide that is partially isolated from one or more adjoining waveguides by conductive obstructions in the signal path to form a waveguide cavity. Conductive obstructions might include a planar, conductive surface that spans the entire height 211 of the waveguide 202, but only spans a portion of the width 212 of the waveguide 202. If a terminating section of waveguide 202 is used then a waveguide cavity may be formed by placing conductive obstructions at the first end 204 (as illustrated in FIG. 4). If a continuous section of waveguide 202 is used, then conductive obstructions may be positioned at both the first end 204 and a second end 206 to form a waveguide cavity (not shown).

Capacitive probes, inductive loops, or capacitive-inductive probes may be used to couple radio frequency signals to and from the interior of the waveguide 202. For example, the first output coupling device 214 and the second output coupling device 216 as shown in FIG. 4 and FIG. 5 are capacitive probes, and are used to couple signals to the first transmission media 302 and the second transmission media 304 respectively. The first output coupling device 214 may have a different capacitance than the second output coupling device 216 to facilitate linear phase shifting over the desired range. Inductive loops are more suited for low impedance applications than the capacitive probes. The high impedance of the capacitive probe can be used to advantage in configuring the combiner 300 to maximize the magnitude of the modulated output signal 514 at a RF output terminal 308. Maximum coupling with the electromagnetic waves in the first mode 508 and second mode 510 occurs when the capacitive probes, such as the input probe 218 (shown in FIG. 5), the first output coupling device 214, or the second output coupling device 216, are parallel to the electric field of the electromagnetic waves propagating in the waveguide 202. Minimal coupling occurs when the capacitive probes are perpendicular to the electric field. For maximum inductive coupling, a cylindrical surface projected from the inductive loop should coaxially intercept the magnetic lines of flux.

An RF oscillator 504 generates a radio frequency carrier signal 512 (i.e. microwave signal). The carrier signal 512 is applied to the input probe 218 (as shown in FIG. 5). Alternatively, if the waveguide 202 is equipped with a first end 204 having a removable portion for covering the opening 205 (as shown in FIG. 4), then the removable portion may be removed and the carrier signal 512 can be inputted at the first end 204 of the waveguide 202 via additional sections of rigid or flexible waveguide.

Two variations of the ferrite polarizer are illustrated. Ferrite polarizer 219 is illustrated in detail in FIG. 4. Alternate ferrite polarizer 221 is the ferrite assembly illustrated in detail in FIG. 5. The ferrite polarizer 219 in FIG. 4 has ferrite material 220, a coil 222, a coil perimeter 222P, a coil terminal 222T, and dielectric material 224. The ferrite polarizer 219 is located in the interior 208 of the waveguide 202. The coil perimeter 222P coaxially surrounds the ferrite material 220, which may be substantially cylindrical as illustrated in FIG. 4. The coil perimeter 222P may substantially conform to the height 211 and width 212 of the waveguide 202 so as not to disrupt the propagation of the carrier signal 512. The ferrite material 220 and the coil 222 are secured to the waveguide by a dielectric material 224. The dielectric material 224 can be a low density foam such as polyethylene or a rigid plastic such as epoxy. If low density foam is used, then the low density foam would surround the coil 222 and the ferrite material 220 and the low density foam would substantially contact the interior 208 of the waveguide at one or more points. If rigid plastic is used the dielectric material 224 can be arranged as a spacer, a framework, or a fastener. Dielectric material so arranged is designated as a dielectric support. The dielectric material 224 also includes any insulation attached to, or substantially coextensive with, the wire used to form the coil 222. The coil 222 may have a plurality of coil windings to permit the generation of magnetic fields with different field strengths.

Referring to FIG. 5, the alternate ferrite polarizer 221 has ferrite material 220, a first electromagnet 226, a second electromagnet 228, a first electromagnet winding 230, a second electromagnet winding 232, and dielectric material 224. The first electromagnet 226 and the second electromagnet 228 are oriented so that magnetic field lines generated from the first electromagnet 226 and the second electromagnet 228 form a curl which is perpendicular to the direction that the carrier signal 512 propagates in the interior 208. The first electromagnet 226 and the second electromagnet 228 are secured to the waveguide interior 208 by the dielectric material 224 or by the first electromagnet windings 226 and the second electromagnet windings 228, respectively. The interior 208 of the waveguide 202 preferably has recesses in walls 210 so that the first electromagnet 226 and the second electromagnet 228 are substantially flush with the non-recessed interior 208 of the walls 210. The ferrite material 220 is secured to the interior 208 by the dielectric material 224 or by a dielectric support.

Voltage is applied to the first electromagnet 226 via the first electromagnet windings 230 and to the second electromagnet 228 via the second electromagnet windings 232.

Generally, the ferrite polarizer 219, or the alternate ferrite polarizer 221, changes the polarity of the carrier signal 512 through Faraday rotation. The ferrite material 220 does not affect the carrier signal 512 when no voltage is applied to the ferrite polarizer 219 or the alternate ferrite polarizer 221. Consequently, if no voltage is applied to the ferrite polarizer 219 or the alternate ferrite polarizer 221, and if the carrier signal 512 has a vertical electrical field (i.e. $TE_{1,0}$ mode), then the maximum coupling of the microwave carrier signal 512 occurs at the second output coupling device 216. In contrast, if a sufficient voltage is applied to the ferrite polarizer 219 or the alternate ferrite polarizer 221 to rotate the polarization of the carrier signal 512 by 90 degrees, and if the microwave carrier signal 512 originally had a vertical electric field, now maximum coupling occurs at the first output coupling device 214. Thus, the carrier signal 512 can selectively be sent to the first output coupling device 214 alone or the second output coupling device 216 alone. In other words, the ferrite system 500 can be used as a radio frequency switch for selectively coupling the carrier signal through the first transmission media 302 or through the second transmission media 304.

The ferrite polarizer 219, or the alternate ferrite polarizer 221, changes the phase of the carrier signal 512 by varying the polarity of the carrier signal 512 thereby affecting the proportion of waves propagating in the first mode to waves propagating in a second mode. In general, the phase X of waves propagating in the first mode and the phase Y of waves propagating in the second mode, vary in a manner determined by the relative location of the input probe 218 (or the optional opening 205) with respect to the location of the first output coupling device 214, the second output coupling device 216, and the internal geometry of the waveguide 202. For example, as illustrated in FIG. 4, the carrier signal 512 with a vertical electric field is advanced in phase by the relative distance from the first output coupling device 214 to the second output coupling device 216 when the ferrite polarizer 219 rotates the microwave carrier signal 512 by 90 degrees. In contrast, if the first output coupling device 214 and the second output coupling device 216 were all rotated by 90 degrees with respect to the input probe 218, the ferrite polarizer 219 would now act as a phase delay unit.

Numerous spacings of the first output coupling device 214 and the second output coupling device 216 can be used to obtain phase modulation or phase shifting. The following spacing of the first output coupling device 214 and the second output coupling device 216 are merely illustrative of one possible embodiment of the invention. Referring to FIG. 5, to produce a variety of phase changes at the RF output terminal 308, the first output coupling device 214 may be located distance $D_1$ from the input probe 218, where $D_1 = Z$, and the second output coupling device 216 may be located distance $D_2$ from the input probe 218, where $D_2 = Z + (W_g/16)$. In practice, distance $D_2$ may literally depart from the foregoing example because of limitations resulting from the particular carrier wavelength used. However, one of ordinary skill in the art knows that integer multiples of electrical wavelengths may be added to $W_g/16$ to retain a virtually identical phase relationship of $W_g/16$ between $D_1$ and $D_2$. $W_g$ is the wavelength of the radio frequency signal or carrier frequency propagating within the waveguide, as opposed to the free-space wavelength. Z is an arbitrary, convenient distance through the waveguide in the direction of propagation. The wavelength of a rectangular waveguide is governed by the following formula: $W_g(m,n) = W_f/[e - (mW_f/2x_o)^2 - (nW_f/2y_o)^2]^{\frac{1}{2}}$, where $W_f$ is th free-space wavelength of the carrier frequency, m,n refer to the modes of propagation, e is the dielectric constant, $x_o$ is the width the rectangular waveguide, and $y_o$ is the height of a rectangular waveguide.

Figure 6:
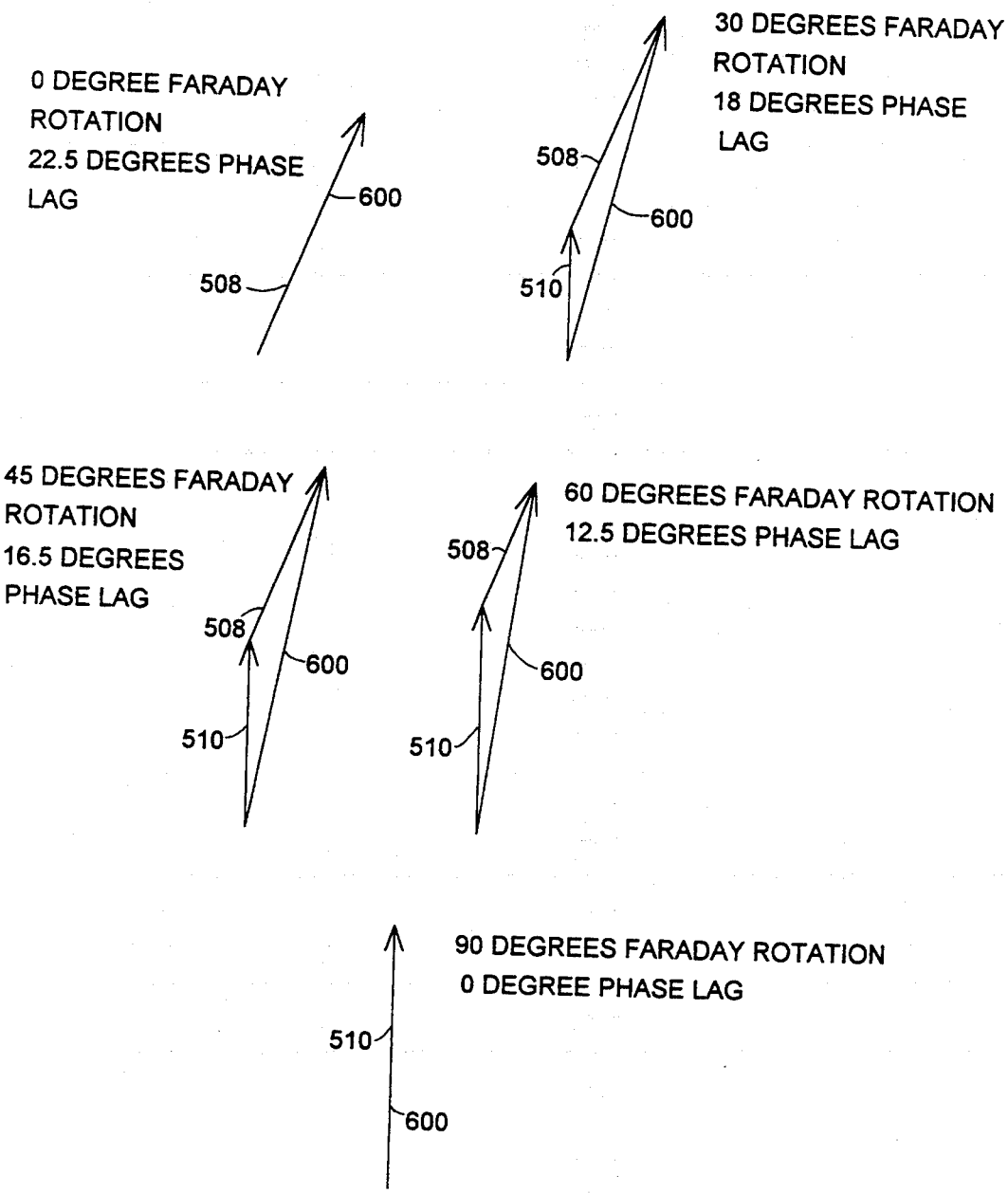
FIG. 6 is a phasor diagram graphically showing how first mode signals and second mode signals add in the combiner to produce varying degrees of resultant phase shift.

Referring to FIG. 5 and FIG. 6, the spacing of the first output coupling device 214 and the second output coupling device 216 with respect to the input probe 218 determines a static phase relationship between the first mode 508 and the second mode 510 waves. The preceding formulae for $D_1$ and $D_2$ fix the relative phase relationship between the first mode of phase X and the second mode of phase Y at 22.5 degrees. However, by selectively altering the magnitude of the waves propagating in the first mode 508, magnitude R, relative to the magnitude of the waves propagating in the second mode 510, magnitude S, through the ferrite polarizer 219, or alternate ferrite polarizer 221, varying degrees of phase shift result. FIG. 6 illustrates how the vector sum 600 of the first mode 508 and the second mode 510 with a constant phase difference of 22.5 degrees between phase X and phase Y produces varying degrees of phase shift because of varying magnitudes of R and S. FIG. 6 also shows that this configuration produces amplitude variations along with the phase modulation. In practice, the radio frequency ferrite system 500 could be followed by a limiter, or preceded by an amplitude compensating circuit correlated to the modulating signal 506, to reduce or eliminate amplitude variations of the modulated output signal 514.

Switching Network

Referring to FIG. 4 and FIG. 5, the switching network 100 has switching elements, a first switching network input 152, second switching network input 153, and switching network output 154. The switching elements may include relays, diodes, transistors, and/or semiconductors. The switching network output 154 is electrically connected to the coil terminal 222T of the ferrite polarizer 219. Alternatively, as shown in FIG. 5, the switching network output 154 is coupled (i.e. electrically connected) to the first electromagnet windings 230 and the second electromagnet windings 232. The switching network output 154 switches the appropriate currents for the coil 222 (FIG. 4) or for the first electromagnet 226 and the second electromagnet 228 (FIG. 5) to induce the desired magnetic field within the interior 208 of the waveguide 202.

FIG. 5 illustrates one possible embodiment of the switching network 100 in greater detail than FIG. 4 does. The switching network 100 in FIG. 5 uses a first power switching transistor 145 and a second power switching transistor 146, as the switching elements. Relays, diodes, and/or other semiconductors could be substituted for the first power switching transistor 145 and the second power switching transistor 146. The switching network 100 in FIG. 5 also contains appropriate DC biasing networks 151 and RF isolation circuitry.

The first power switching transistor 145 and the second power switching transistor 146 independently control the current through the first electromagnet windings 230 and the second electromagnet windings 232 respectively. Current flowing in the first electromagnet windings 230 and the second electromagnet windings 232, regulates the magnetic fields in the waveguide 202. The strength and orientation of the magnetic fields in the waveguide 202 are used to affect the modes in which the waves in the waveguide 202 propagate. The switching elements can be activated independently so that four possible states exist with two switching elements: on, on; off,on; on, off; and off, off. Each state can correspond to a discrete level of phase shift. Consequently, quadrature phase shift keying is theoretically possible via the first power switching transistor 145 and the second power switching transistor 146.

To activate the first power switching transistor 145, or the second power switching transistor 146, or both the first power switching transistor 145 and the second power switching transistor 146, voltages are provided at the first switching network input 152. As shown in FIG. 5, the first switching network input 152 includes the first base input 103A and the second base input 103C. The second switching network input 153 include the first collector input 103B and the second collector input 103D.

The modulating signal 506 is a logic level input (i.e. TTL logic levels), or a substantially sinusoidal input, or any waveform, from the modulating signal source 502. The modulating signal 506 is applied to first base input 103A or the second base input 103C, or to both the first base input 103A and the second base input 103C. Meanwhile, an energy regulator, such as a voltage regulator 400, applies the appropriate energy (i.e. voltage) to the first power transistor 145 via first collector input 103B and the appropriate energy (i.e. voltage) to the second power transistor 146 via second collector input 103D to cause discrete levels of rotation of the radio frequency carrier signal 512 within the waveguide 202. For example, the energy levels applied to the first collector input 103B and to the second collector input 103D could be selected such that simultaneously activating the first power transistor 145 and activating the second power transistor 146 causes the ferrite polarizer 221 to rotate the microwave carrier by 90 degrees in polarity. Thus, a substantial portion of the carrier wave formerly propagating in the first mode would now propagate in the second mode. The resulting ratio of first mode waves to second mode waves in the waveguide 202 would depend upon the size, positioning, and efficiency of the alternate ferrite polarizer 221.

The appropriate current, and corresponding magnetic field, associated with the first electromagnet windings 230 and the second electromagnet windings 232 will vary according to the permeability of the ferrite material 220, the geometric configuration of the alternate ferrite polarizer 221, and the desired degree of Faraday rotation. In FIG. 5, one desired degree of Faraday rotation is 90 degrees because of the relative locations of the input probe 218, the first output coupling device 214 and the second output coupling device 216. A first current adjusting resistor 147 and a second current adjusting resistor 148 are provided to ground any excess current potentially flowing in the first electromagnet windings 230 or the second electromagnet windings 232. Although potentiometers are illustrated as the first current adjusting resistor 147 and the second current adjusting resistor 148 in FIG. 5, fixed resistors could be used, or no resistors at all could be used if less control over the degree of Faraday rotation was permissible.

Current sensing resistor 149 provides feedback on the current flowing through the first electromagnet windings 230 to the voltage regulator 400 at feedback terminal 103E so that the voltage regulator 400 can adjust the regulated voltage applied to the first collector input 103B and, if necessary, to the second collector input 103D accordingly. The resistance of the current sensing resistor 149 should be high enough so that the current flow through the first electromagnet windings 230 is not appreciably affected.

The first current limiting resistor 141 and second current limiting resistor 142 are chosen to limit the base current in the first power switching transistor 145 and the second power switching transistor 146 to levels which will not damage the first power switching transistor 145 or the second power switching transistor 146. The first RF interference eliminating capacitor 143 prevents stray lower frequency radio waves, from sources such as commercial broadcasts, from changing the base-emitter bias on the first power switching transistor 145. The second RF interference eliminating capacitor 144 prevents stray lower frequency radio waves from commercial broadcasts from changing the base-emitter bias on the second power switching transistor 146. Capacitors 143 and 144 should have a low reactance on the commercial AM band and other frequencies which could cause potential interference problems.

Energy Regulator

The energy regulator comprises a shunt voltage regulator, a series voltage regulator, a zener diode voltage regulator, a generic regulator, or the like. Referring to FIG. 3, FIG. 4, and FIG. 5, the voltage regulator 400 preferably applies regulated voltages to the second switching network input 153. If the regulated voltages are applied to the first collector input 103B and the second collector input 103D of FIG. 5, then the regulated voltages are selected to provide the appropriate current in the first electromagnet windings 230 and the second electromagnetic windings 232 to induce a corresponding magnetic field about the first electromagnet 226 and the second electromagnet 228.

Current sensing resistor 149 provides feedback on the current flowing through the first electromagnet windings 230 via the feedback terminal 103E. Feedback is provided to the voltage regulator 400 so that the voltage regulator 400 can adjust the regulated energy or voltage applied to first collector input 103B and the second collector input 103D accordingly. Thus, the voltage regulator 400 changes the output level of said voltage regulator 400 as necessary to achieve reliable, consistent degree of Faraday rotation.

Additionally, the voltage regulator 400 may couple the feedback terminal 103E to a comparison input of an operational amplifier comparator. The comparator compares a reference input to the comparison input in accordance with any method known to one of ordinary skill in the art. The output of the operational amplifier comparator could be used to switch in voltage dividing resistors to adjust the voltage applied to terminal first collector input 103B and the second collector input 103D.

Combiner

Referring to FIG. 3 through FIG. 6, inclusive, the combiner 300 electrically combines the first mode signal 508 with the second mode signal 510. The combination of the first mode signal 508 and the second mode signal 510 is best illustrated by the examples provided in FIG. 6. The combiner may be a hybrid combiner such as a coaxial hybrid combiner.

As illustrated in FIG. 4 and FIG. 5, the combiner 300 has a first transmission media 302, a second transmission media 304, which are joined at a junction 306. The junction 306 primarily refers to the location where the first transmission media 302 and the second transmission media 304 are coupled. The junction 306 may also refer to a coaxial cable connector (i.e. a coaxial tee connector as shown in FIG. 4 and FIG. 5) or an electrical connection in specific embodiments. The first transmission media 302 or the second transmission media 304 may be constructed from coaxial cable, stripline, microstrip, or the like. The first transmission media 302 has an alpha end 310 and a beta end 312. The second transmission media 304 has an alpha termination 314 and a beta termination 316. The alpha end 310 and alpha termination 314 are coupled (i.e. electromagnetically coupled or electrically connected) to the junction 306. The beta end 312 is coupled to the first output coupling device 214 and the beta termination 316 is coupled to the second output coupling device 216.

The individual lengths of the first transmission media 302 and the second transmission media 304 are each preferably one-half of an electrical wavelength at the resonant frequency of operation if the first output coupling device 214 and the second output coupling device 216 are capacitive probes. If approximately one-half electrical wavelength sections are used for the first transmission media 302 and the second transmission media 304, then the high characteristic impedance of the first output coupling device 214 and the second output coupling device 216 will be reflected to the junction 306 thereby maximizing the modulated output signal 514 at the RF output terminal 308.

Stripline or microstrip maybe used to construct the combiner 300. If stripline is used for the first transmission media 302 and the second transmission media 304, and at the junction 306, then the characteristic impedance of the stripline is determined by the width of the etching and the relative spacing of the metallic cladding on one side of a plastic or phenolic composition board to the etching on the other side of the board affect the characteristic impedance. Characteristic impedance $= 377 \ h/[e_r^{0.5} * W(1 + 1.735 \ e_r^{-0.0724}(W/h)^{-0.0836})]$, where W is width of the stripline etching; h is the thickness of the dielectric, and $e_r$ is the dielectric constant of the board. The geometry of the board and the dielectric constant also determine the electrical length of the required resonant wavelength. In particular, the electrical length is given by first multiplying the free-space wavelength by the ratio of the double-cladded board thickness to the width of the stripline, and then dividing the result by the dielectric constant of the board.

The foregoing detailed description is provided in sufficient detail to enable one of ordinary skill in the art to make and use the ferrite system for manipulating radio frequency energy. The foregoing detailed description is merely illustrative of several physical embodiments of the ferrite system. Physical variations of the ferrite system, not fully described in the specification, are encompassed within the purview of the claims. Accordingly, the narrow descriptions of the elements in the specification should not be used to unduly restrict the broader descriptions of elements in the following claims.

I claim:

1. A ferrite system for manipulating radio frequency energy, said manipulating including shifting the phase of the radio frequency energy, said ferrite system comprising:

a resonator, the resonator having a resonator cross section, a resonator interior, and resonator walls, the resonator cross section selected to permit simultaneous propagation of the radio frequency energy in a first mode and a second mode, the electric field of the first mode oriented substantially perpendicular to the electric field of the second mode;

first coupling means for coupling the radio frequency energy into said resonator interior, said first coupling means being associated with one of said resonator walls;

second coupling means for coupling the radio frequency energy from said resonator interior, said second coupling means being associated with one of said resonator walls;

a ferrite polarizer, the ferrite polarizer having ferrite material, a coil, and dielectric material, the ferrite material mainly or completely disposed in the resonator interior, the dielectric material securing the ferrite polarizer relative to the resonator; and a protrusion located in the resonator interior, the protrusion being electrically conductive, said protrusion having dimensions and a shape selected to form a reactance over a predetermined frequency range of the radio frequency energy.

2. The ferrite system according to claim 1 wherein the resonator cross section has a form selected from the group consisting of a substantially circular form, a substantially rectangular form, a substantially elliptical form, and a substantially polygonal form.

3. The ferrite system according to claim 1 wherein the coil has a coil perimeter and the ferrite material is coaxially disposed within the coil perimeter.

4. The ferrite system according to claim 1 wherein each one of the first coupling means and the second coupling means is selected from the group consisting of a capacitive probe, an inductive loop, and a capacitive-inductive probe;

the first coupling means being perpendicularly oriented with respect at least one resonator wall, and the first coupling means being substantially electrically insulated, at direct current, from the resonator walls; and the second coupling means being perpendicularly oriented with respect to at least one resonator wall, the second coupling means being substantially electrically insulated, at direct current, from the resonator walls.

5. The ferrite system of claim 1 wherein the first coupling means comprises a first coupling device selected from the group consisting of a first plurality of apertures, a first plurality of slots, a first slot, and a first aperture, the first coupling means being located in at least one resonator wall; and the second coupling means comprises a second coupling device selected from the group consisting of a second plurality of apertures, a second plurality of slots, a second slot, and a second aperture, the second coupling means being located in at least one resonator wall.

6. The ferrite system according to claim 1 wherein the first coupling means includes a first slot and wherein the second coupling means includes a second slot, the first slot and the second slot being substantially rectangular, the first slot and the second slot located in at least one resonator wall.

7. The ferrite system according to claim 1 wherein the second coupling means comprises second coupling means for coupling the first mode and the second mode of the radio frequency energy from the resonator interior.

8. The ferrite system of claim 1 wherein the protrusion is a fastener selected from the group consisting of a screw, a bolt, a rivet and a stud.

9. The ferrite system of claim 8 wherein the fastener has fastener threads, and the resonator has resonator threads, said resonator threads being attached to one wall, respective fastener threads engaging corresponding resonator threads.

10. The ferrite system of claim 1 wherein the shape and the dimensions of the protrusion are substantially rectangular and substantially planar.

11. A ferrite system for manipulating radio frequency energy comprising:
  means for altering phase of radio frequency energy, the means for altering phase having a resonator, a plurality of output coupling devices, and a ferrite polarizer;
  the resonator having an interior, and a cross section, said cross section bounding a height and a width, the height and the width selected to permit simultaneous propagation of a radio frequency signal in a plurality of orthogonal modes;
  the plurality of output coupling devices including a first output coupling device and a second output coupling device, the first output coupling device oriented substantially perpendicular to the second output coupling device, the plurality of output coupling devices associated with the interior;
  the ferrite polarizer having ferrite material, a coil, and dielectric material, the ferrite material disposed in the interior of the resonator, the dielectric material securing the ferrite polarizer relative to the resonator; and a combiner, the combiner coupled (electrically or electromagnetically) to the first output coupling device and to the second output coupling device.

12. The ferrite system according to claim 11 wherein said resonator is selected from the group consisting of a waveguide, a terminating section of waveguide, a conventional cavity, and a waveguide cavity.

13. The ferrite system according to claim 11 wherein each one of the plurality of output coupling devices is selected from the group consisting of a capacitive probe, an inductive loop, a capacitive-inductive probe, and a slot.

14. The ferrite system according to claim 11 wherein the dimensions of the coil substantially approach the height and the width of the resonator.

15. The ferrite system according to claim 11 wherein the dielectric material is selected from the group consisting of epoxy, polyester, polyvinyl, polypropylene, polyethylene and polystyrene.

16. The ferrite system according to claim 11 wherein the combiner further comprises
  a first transmission media and a second transmission media, the first transmission media having an alpha end and a beta end, the second transmission media having an alpha termination and a beta termination, the alpha end coupled (electrically or electromagnetically) to the alpha termination, the beta end coupled (electrically or electromagnetically) to the first output coupling device, the beta termination coupled (electrically or electromagnetically) to the second output coupling device.

17. The ferrite system according to claim 16 wherein electrical lengths of the first transmission media and the second transmission media are selected to produce a predetermined impedance at a junction, so that the predetermined impedance is greater than a conventional impedance of a particular radio frequency device being coupled to said junction.

18. The ferrite system according to claim 11 wherein the first transmission media and the second transmission media are selected from the group consisting of coaxial cable, waveguides, stripline and microstrip.

19. The ferrite system according to claim 11 wherein the combiner is selected from the group consisting of a waveguide hybrid, a coaxial hybrid, a stripline hybrid, a microstrip hybrid, and a hybrid ring.

20. The ferrite system for manipulating radio frequency energy according to claim 11 wherein the coil has a coil perimeter and the ferrite material is coaxially disposed within the coil perimeter.

21. The ferrite system for manipulating radio frequency energy according to claim 11 wherein the coil has a plurality of coil windings.

22. The ferrite system for manipulating radio frequency energy according to claim 11 wherein said coil is coaxially disposed about a corresponding core, said coil located in the interior.

23. The ferrite system for manipulating radio frequency energy according to claim 11 further comprising:
  a switching network having a switching element, a first switching network input, a second switching network output, the switching network input being coupled to a modulating signal source, the switching network providing an appropriate current for said coil to induce a desired magnetic field within the interior of the resonator; and
  an energy source regulator providing regulated energy to the second switching network input.

24. The ferrite system for manipulating radio frequency energy according to claim 23 wherein said switching network has a plurality of switching elements, and said coil has a plurality of coil windings, respective ones of the coil windings being associated with corresponding ones of said switching elements, corresponding ones of said switching elements switching discrete energy levels to respective ones of said coil windings, the energy regulator supplying discrete energy levels to each switching element.

25. A ferrite system for manipulating radio frequency energy, said manipulating including phase shifting of radio frequency energy, said ferrite system comprising:
  a waveguide, the waveguide having a substantially rectangular cross section, a first end, a second end, and an interior, the rectangular cross section having a height and a width, the height and the width having a relative ratio which permits electromagnetic propagation of a first mode wave and a second mode wave of a radio frequency signal, the first end defining an opening, the opening situated to allow the introduction of the radio frequency signal, the first end having a sufficient size to reflect a portion of the radio frequency signal within the interior;

a plurality of output coupling devices including a first output coupling device and a second output coupling device, the first output coupling device oriented substantially perpendicular relative to the second output coupling device, the first output coupling device situated in the interior of the waveguide to maximize reception of the first mode wave, the second output coupling device situated the interior of the waveguide to maximize reception of the second mode wave, a ferrite polarizer, the ferrite polarizer having ferrite material, dielectric material, and electromagnets, the ferrite material coaxially disposed within the interior to alter the polarization of the radio frequency signal introduced at the first end of the waveguide, the electromagnets located in the interior, the electromagnets having a first electromagnet winding and a second electromagnet winding;

a switching network, the switching network having a first semiconductor, a second semiconductor, a first switching network input, a second switching network input, and a switching network output, the first semiconductor and the second semiconductor responsive to energy applied at the first switching network input, the switching network output coupled (electrically or electromagnetically) to the first electromagnet windings and the second electromagnet windings;

an energy regulator, the energy regulator providing energy to the second switching network input, and a combiner, the combiner having a first transmission media and a second transmission media, the first transmission media and the second transmission media selected from the group consisting of coaxial cable, waveguides, stripline, and microstrip, the first transmission media and the second transmission media are coupled (electrically or electromagnetically) at a junction, the first transmission media coupled to the first output coupling device and the second transmission media coupled to the second output coupling device.

26. The ferrite system according to claim 25 wherein the first end further has a removable portion, said removable portion being attached to the waveguide to substantially cover said opening defined in said first end and wherein an input probe is located near the first end so as to form a resonant cavity at an operating frequency of the radio frequency signal.

27. The ferrite system according to claim 25 wherein the interior of the waveguide has recesses and a non-recessed interior region adjacent to the recesses, said electromagnets being positioned in said recesses such that the electromagnets are substantially coextensive with the non-recessed interior region of the waveguide, the electromagnets being secured by the dielectric material.

28. The ferrite system of claim 25 wherein the energy regulator comprises a voltage regulator, and wherein the voltage regulator has a comparator, a plurality of regulator switches, and a voltage dividing network, the comparator having a comparator input and a comparator output, the comparator input receiving a feedback voltage from an electrical connection to the first electromagnet windings, the comparator output activating said regulator switches in cooperative association with said voltage dividing network thereby regulating the energy level supplied at the second switching network input.

29. The ferrite system according to claim 25 wherein each one of the first transmission media and the second transmission media is a multiple of approximately one-half of an electrical wavelength at an operating frequency of the radio frequency signal and wherein said output coupling devices comprise capacitive probes.

30. The ferrite system according to claim 25 wherein each one of the first transmission media and the second transmission media is a multiple of approximately one-quarter of an electrical wavelength at an operating frequency of the radio frequency signal and wherein said output coupling devices comprise inductive loops.

* * * * *